(12) United States Patent  
Sekiya (10) Patent No.: US 10,916,466 B2  
(45) Date of Patent: Feb. 9, 2021

(54) WAFER UNITING METHOD

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/539,481

(22) Filed: Aug. 13, 2019

(65) Prior Publication Data

US 2020/0058537 A1  Feb. 20, 2020

(30) Foreign Application Priority Data

Aug. 17, 2018 (JP) ................. 2018-153469

(51) Int. Cl.
| | |
|---|---|
| H01L 21/683 | (2006.01) |
| H01L 21/78 | (2006.01) |
| H01L 21/67 | (2006.01) |
| H01L 21/304 | (2006.01) |
| H01L 23/00 | (2006.01) |
| B23K 20/02 | (2006.01) |

(52) U.S. Cl.
CPC ........ *H01L 21/6836* (2013.01); *B23K 20/025* (2013.01); *H01L 21/304* (2013.01); *H01L 21/67092* (2013.01); *H01L 21/67132* (2013.01); *H01L 21/6838* (2013.01); *H01L 21/78* (2013.01); *H01L 24/85* (2013.01); *H01L 2221/68327* (2013.01); *H01L 2221/68386* (2013.01); *H01L 2224/85203* (2013.01)

(58) Field of Classification Search
CPC .............. H01L 25/0657; H01L 23/3135; H01L 23/544; H01L 25/50; H01L 24/97  
See application file for complete search history.

(56) References Cited

U.S. PATENT DOCUMENTS

| | | | |
|---|---|---|---|
| 2007/0071969 A1* | 3/2007 | Kontani | C08G 18/8116 428/343 |
| 2017/0210085 A1* | 7/2017 | Uemura | B32B 27/18 |
| 2018/0019223 A1* | 1/2018 | Terada | H01L 24/81 |
| 2018/0190532 A1* | 7/2018 | Sugiyama | B32B 9/04 |
| 2018/0323084 A1* | 11/2018 | Yamagishi | H01L 21/563 |

FOREIGN PATENT DOCUMENTS

JP  2005246491 A  9/2005

\* cited by examiner

*Primary Examiner* — Brian Turner  
(74) *Attorney, Agent, or Firm* — Greer Burns & Crain Ltd.

(57) ABSTRACT

A wafer uniting method includes a thermocompression bonding step of causing a thermocompression bonding sheet having a size comparable to or greater than a size and a shape of a wafer and a front surface of the wafer to face each other, and pressing them against each other while applying heat to thermocompression bond the thermocompression bonding sheet to the front surface of the wafer. The thermocompression bonding sheet thermocompression bonded to the wafer in the thermocompression bonding step includes at least a first thermocompression bonding sheet and a second thermocompression bonding sheet.

10 Claims, 5 Drawing Sheets

WAFER UNITING METHOD

BACKGROUND OF THE INVENTION

Field of the Invention

The present invention relates to a wafer uniting method of laying a protective member on a front surface of a wafer formed with a plurality of devices partitioned by a plurality of intersecting streets, and uniting the protective member with the wafer.

Description of the Related Art

A wafer formed on a front surface thereof with a plurality of devices such as integrated circuits (ICs) and large scale integrated circuits (LSIs) in the state of being partitioned by a plurality of intersecting streets is thinned to a predetermined thickness by grinding a back surface thereof by a grinding apparatus, is then divided into individual device chips by a dicing apparatus, and the thus divided device chips are utilized for electric apparatuses such as mobile phones and personal computers.

The grinding apparatus includes at least a chuck table having a holding surface for holding the wafer, grinding means including in a rotatable manner a grinding wheel for grinding an upper surface of the wafer held by the chuck table, and grinding feeding means for performing grinding feeding of grindstones, and is able to process the wafer to a desired thickness (see, for example, Japanese Patent Laid-open No. 2005-246491).

In the above-mentioned grinding apparatus, at the time of grinding the upper surface of the wafer, a protective tape as a protective member having a pressure sensitive adhesive layer is adhered to the front surface of the wafer, such that the plurality of devices formed on the front surface of the wafer would not be damaged by contact between the holding surface of the chuck table and the front surface of the wafer.

SUMMARY OF THE INVENTION

In the case where the protective tape having a pressure sensitive adhesive layer is adhered to the front surface of the wafer, then the wafer is held on a chuck table and the back surface of the wafer is ground, when projection-shaped electrodes (projections) called bumps are formed on the front surface of the wafer, there may arise a problem in which at the time of grinding the wafer by a grinding wheel, the back surface of the wafer is not ground uniformly, the grinding amount of the back surface at positions corresponding to the individual bumps is increased as compared to other regions, and recesses (dimples) are generated correspondingly to the bumps, resulting in ruggedness (projections and recesses). To cope with this problem, an attempt has been made to use a protective tape for absorbing or completely enveloping the bumps and thereby to restrain the generation of dimples. However, upon peeling off of the protective tape from the front surface of the wafer after completion of the grinding, a problem has been generated in which part of the glue constituting the pressure sensitive adhesive layer of the protective tape would remain adhering to the front surface of the wafer, leading to a lowering in the quality of the individually divided device chips.

As a countermeasure against the above-mentioned problem, the present applicants have developed a processing technology by which the back surface of the wafer can be ground without generating dimples in the back surface. In the processing technology, a thermocompression bonding sheet such as a polyolefin sheet and a polyester sheet is laid on the front surface of the wafer without using any glue or the like, and high heat is applied to the thermocompression bonding sheet to render the thermocompression bonding sheet fluid and to thermocompression bond the thermocompression bonding sheet to the wafer in the manner of enveloping the bumps, thereby uniting the thermocompression bonding sheet with the wafer. Then, the thermocompression bonding sheet side is held by a chuck table, and the back surface of the wafer is ground.

According to the just-mentioned processing technology, the front surface of the wafer is protected using the thermocompression bonding sheet, whereby the back surface can be ground without generating dimples, and, since the thermocompression bonding sheet is thermocompression bonded to the front surface of the wafer without using any glue, the problem of remaining of part of such a glue on the front surface of the wafer is obviated. However, at the time of peeling off the thermocompression bonding sheet from the front surface of the wafer after grinding of the back surface of the wafer or the like, a new problem has been generated in which the parts thermocompression bonded in the manner of enveloping the bumps would not be released from the bumps, and the bumps would be torn off by the thermocompression bonding sheet, resulting in damaging of the devices.

Accordingly, it is an object of the present invention to provide a wafer uniting method by which a protective member can be peeled off without leaving a glue on a wafer and, hence, without damaging devices.

In accordance with an aspect of the present invention, there is provided a wafer uniting method of laying a thermocompression bonding sheet, which functions as a protective member in a processing step of processing a back surface of a wafer formed on a front surface thereof with a plurality of devices partitioned by a plurality of intersecting streets, on the front surface of the wafer and uniting the wafer with the thermocompression bonding sheet, the method including: a thermocompression bonding step of causing the thermocompression bonding sheet having a size comparable to or greater than a size and a shape of the wafer and the front surface of the wafer to face each other, and pressing them against each other while applying heat, to thermocompression bond the thermocompression bonding sheet to the front surface of the wafer. The thermocompression bonding sheet thermocompression bonded to the wafer in the thermocompression bonding step includes at least a first thermocompression bonding sheet and a second thermocompression bonding sheet, and the first thermocompression bonding sheet is thermocompression bonded to the front surface of the wafer without completely enveloping projections formed on the front surface of the wafer, whereas the second thermocompression bonding sheet has a one end side surface thereof put into close contact with the first thermocompression bonding sheet while having fluidity and thermocompression bonded to the first thermocompression bonding sheet, and has other end side surface thereof formed to be a flat surface.

Preferably, the first thermocompression bonding sheet and the second thermocompression bonding sheet may each include a polyolefin sheet; in that case, the first thermocompression bonding sheet includes a polyester sheet, and the second thermocompression bonding sheet includes a polyolefin sheet.

Preferably, the first thermocompression bonding sheet may include a polyester sheet and the second thermocompression bonding sheet may include a polyolefin sheet; in that case, the first thermocompression bonding sheet is a polyethylene naphthalate sheet, and the second thermocompression bonding sheet is a polyethylene sheet.

Preferably, the first thermocompression bonding sheet and the second thermocompression bonding sheet are selected in such a manner that a melting temperature of the second thermocompression bonding sheet is lower than a melting temperature of the first thermocompression bonding sheet.

According to the present invention, even in the case where projections such as bumps constituting electrodes of devices formed on a front surface of a wafer are disposed on the front surface of the wafer, peeling off of a thermocompression bonding sheet from the front surface of the wafer after processing of a back surface of the wafer can be performed while avoiding a problem in which part of a glue of a pressure sensitive adhesive layer remains adhering to the front surface of the wafer, and, hence, tearing-off of the projections such as bumps by the thermocompression bonding sheet can be prevented from occurring, so that a problem of damaging of the devices can be obviated.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Figure 1:
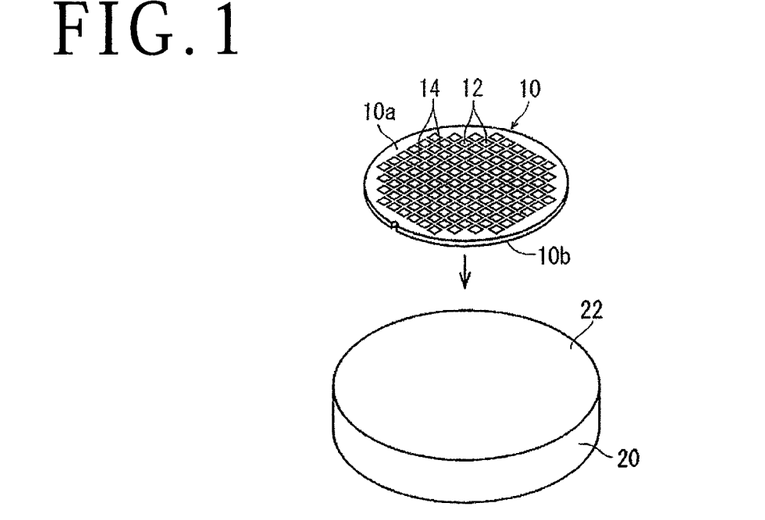
FIG. 1 is a perspective view depicting a state in which a wafer is placed on a support table for carrying out a thermocompression bonding step thereon.

An embodiment of a wafer uniting method according to the present invention will be described in detail below, referring to the attached drawings. In carrying out the wafer uniting method of the present embodiment, first, as depicted in FIG. 1, a wafer 10 to be united with a thermocompression bonding sheet is prepared. The wafer 10 has a plurality of devices 12 partitioned by a plurality of intersecting streets 14 on a front surface 10a thereof. After the wafer 10 is prepared, the wafer 10 is placed, with its front surface 10a directed up, on an upper surface 22 of a support table 20 for carrying out a thermocompression bonding step including a first thermocompression bonding step and a second thermocompression bonding step. The support table 20 is formed in a large size relative to the wafer 10, and its upper surface 22 is a flat surface.

Figure 2:
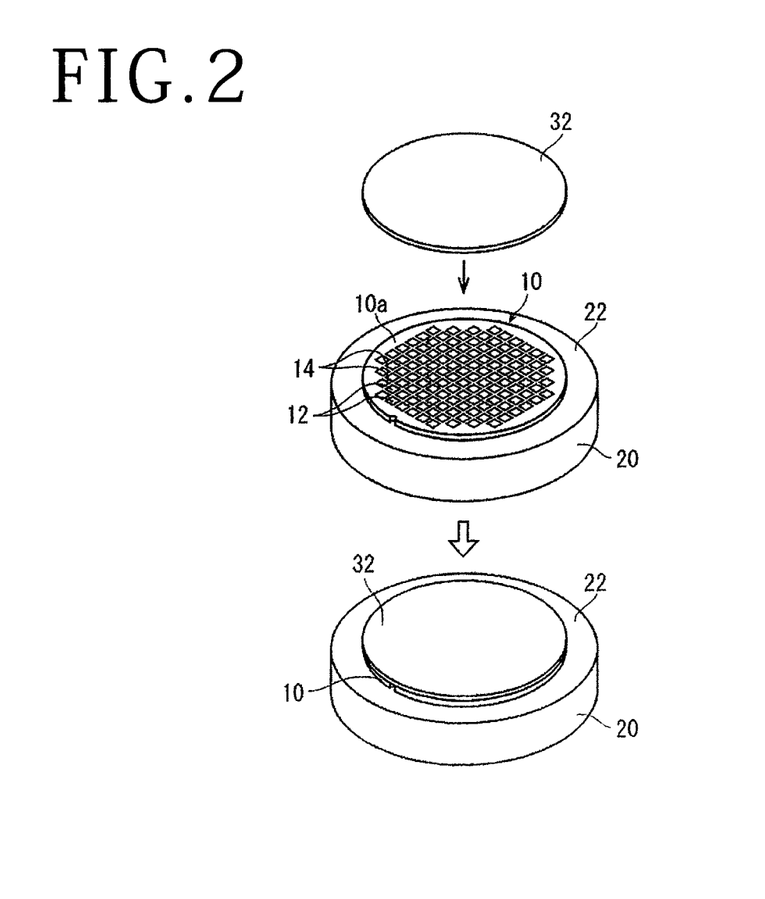
FIG. 2 is a perspective view depicting a state in which a first thermocompression bonding sheet is placed on a front surface of the wafer of FIG. 1.

After the wafer 10 is placed on the support table 20 as above-mentioned, a first thermocompression bonding sheet 32 formed in a size comparable to or slightly larger than a size of the shape of the wafer 10 is prepared, and, as depicted in FIG. 2, the first thermocompression bonding sheet 32 and the front surface 10a of the wafer 10 are caused to face each other. The first thermocompression bonding sheet 32 can be selected from among either polyolefin sheets or polyester sheets. In the present embodiment, a polypropylene sheet which is a polyolefin sheet is selected as the first thermocompression bonding sheet 32.

Figure 3A:
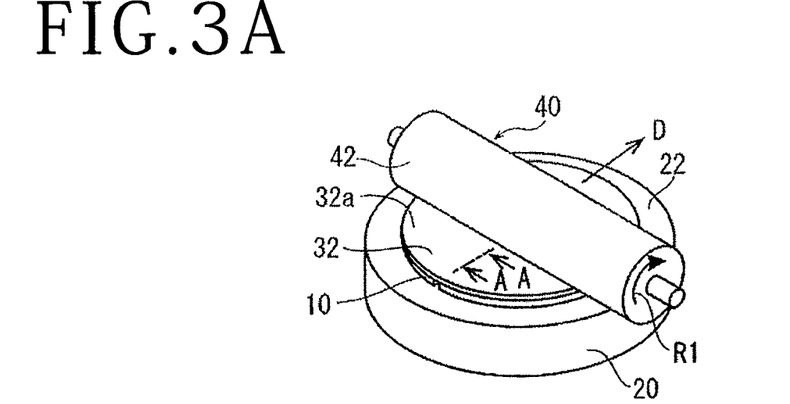
FIG. 3A is a perspective view depicting a mode in which a first thermocompression bonding step of thermocompression bonding the first thermocompression bonding sheet to the wafer is carried out.

After the first thermocompression bonding sheet 32 is placed on the wafer 10, next, a heating roller 40 for thermocompression bonding illustrated in FIG. 3A is prepared, and is located on an upper side of the support table 20, or on an upper side of the wafer 10. The heating roller 40 is rotatably supported by support means (not illustrated). The longitudinal size of the heating roller 40 is at least greater than the diameter size of the wafer 10, preferably set to be slightly greater than the diameter of the support table 20. A surface 42 of the heating roller 40 has been subjected to coating with a fluororesin, a heater for heating (not illustrated) and a temperature sensor and the like (not illustrated) are incorporated in the heating roller 40, and power source is supplied from a controller (not illustrated), whereby the heating roller 40 is controlled to a desired temperature.

After the heating roller 40 is located on the upper side of the wafer 10, the heating roller 40 is lowered in a state in which the heater for heating is operated, to position the heating roller such as to press an outer peripheral end portion of the wafer 10, and, as illustrated in FIG. 3A, the heating roller 40 is slowly moved in the direction of arrow D while being rotated in the direction of arrow R1. While the melting temperature of the polypropylene sheet selected as the first thermocompression bonding sheet 32 is 160° C. to 180° C., the heating roller 40 is set to a temperature (for example, 100° C. to 120° C.) lower than the melting temperature by 60° C. to 80° C. By this, heat is applied from the heating roller 40 to the first thermocompression bonding sheet 32, and the first thermocompression bonding sheet 32 is softened to such an extent as not to acquire fluidity, and is brought into a state of exhibiting pressure sensitive adhesiveness. As a result, in a state in which a glue or the like to be a pressure sensitive adhesive layer is not applied to either of the first thermocompression bonding sheet 32 and the wafer 10, the first thermocompression bonding sheet 32 is thermocompression bonded to the front surface 10a of the wafer 10, and the first thermocompression bonding sheet 32 and the wafer 10 are united with each other (first thermocompression bonding step).

In this instance, though the first thermocompression bonding sheet 32 is softened as compared to its state before heating, it is merely softened to such an extent as not to have fluidity. Therefore, as understood from FIG. 3B as a sectional view taken along line A-A of FIG. 3A, the first thermocompression bonding sheet 32 does not come into a state of completely enveloping bumps 16 forming projections formed on the surface of the wafer 10, and some gaps S1 are left at root portions of the bumps 16. As a result, at an upper surface 32a of the first thermocompression bonding sheet 32 united with the wafer 10, ruggedness (projections and recesses) due to the bumps 16 appears. Note that although the first thermocompression bonding sheet 32 is brought into a pressure sensitive adhesive state when heated, the coating of the surface 42 of the heating roller 40 with the fluororesin prevents the first thermocompression bonding sheet 32 from adhering to the surface 42 of the heating roller 40, so that the progress of the thermocompression bonding step is not obstructed.

Figure 4:
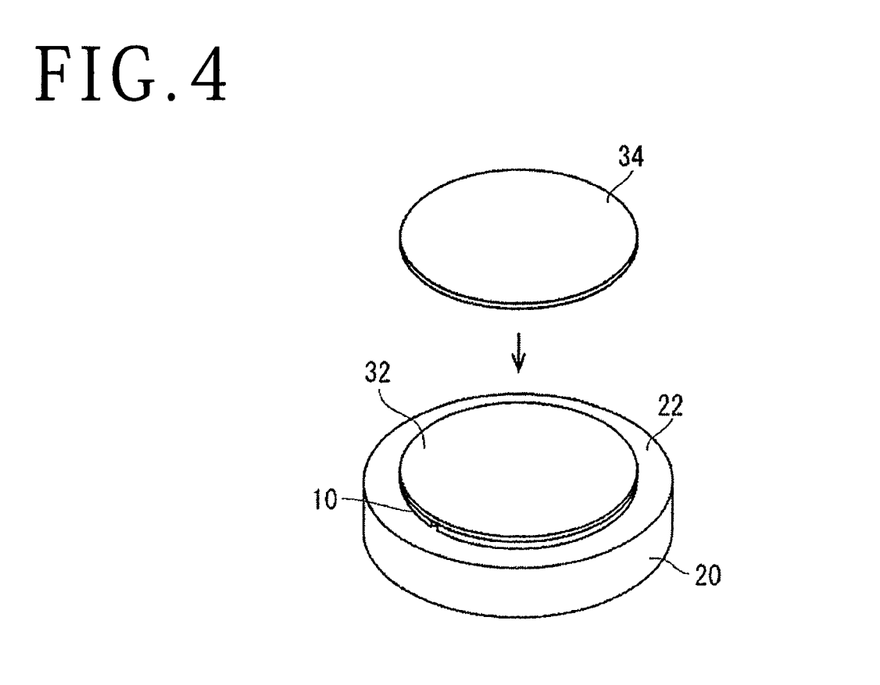
FIG. 4 is a perspective view depicting a state in which a second thermocompression bonding sheet is placed on the first thermocompression bonding sheet thermocompression bonded to the wafer.

After the first thermocompression bonding sheet 32 and the wafer 10 are united with each other as above-mentioned, a second thermocompression bonding sheet 34 set in substantially the same shape as the first thermocompression bonding sheet 32 is prepared, as depicted in FIG. 4. In the present embodiment, a polyethylene sheet which is a polyolefin sheet is selected as the second thermocompression bonding sheet 34. After the second thermocompression bonding sheet 34 is prepared, the second thermocompression bonding sheet 34 is placed on the first thermocompression bonding sheet 32 united with the wafer 10, as illustrated in FIG. 4.

Figure 5A:
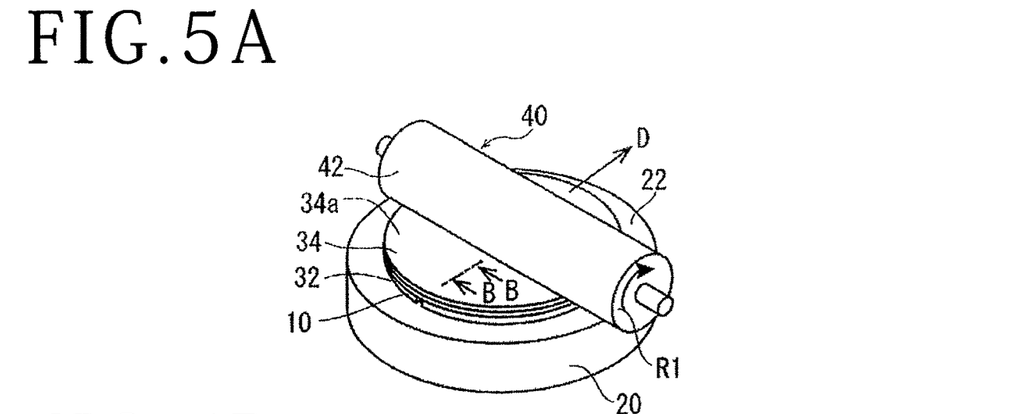
FIG. 5A is a perspective view depicting a mode in which a second thermocompression bonding step of thermocompression bonding the second thermocompression bonding sheet onto the first thermocompression bonding sheet is carried out.

Next, as depicted in FIG. 5A, the heating roller 40 is pressed against the second thermocompression bonding sheet 34 while applying heat, and the heating roller 40 is moved in the direction of arrow D while rotating the heating roller 40 in the direction of arrow R1, to thermocompression bond the second thermocompression bonding sheet 34 onto the first thermocompression bonding sheet 32, thereby uniting them with each other (second thermocompression bonding step). Note that in carrying out the second thermocompression bonding step, the temperature of the heater for heating (not illustrated) incorporated in the heating roller 40 is set to a temperature in the range of the melting temperature (120° C. to 140° C.) of the polyethylene sheet, for example, approximately 120° C. When the thermocompression bonding is performed while heating the second thermocompression bonding sheet 34 to the melting temperature by the heating roller 40 in this way, the second thermocompression bonding sheet 34 is brought into a fluid state. Therefore, as understood from FIG. 5B as a sectional view taken along line B-B of FIG. 5A, the second thermocompression bonding sheet 34 gets into close contact with the first thermocompression bonding sheet 32 to absorb the ruggedness (projections and recesses) appearing on the first thermocompression bonding sheet 32, and its surface on the side opposite to the first thermocompression bonding sheet 32, that is, its upper surface 34a in contact with the heating roller 40 is formed to be a flat surface.

Figure 5B:
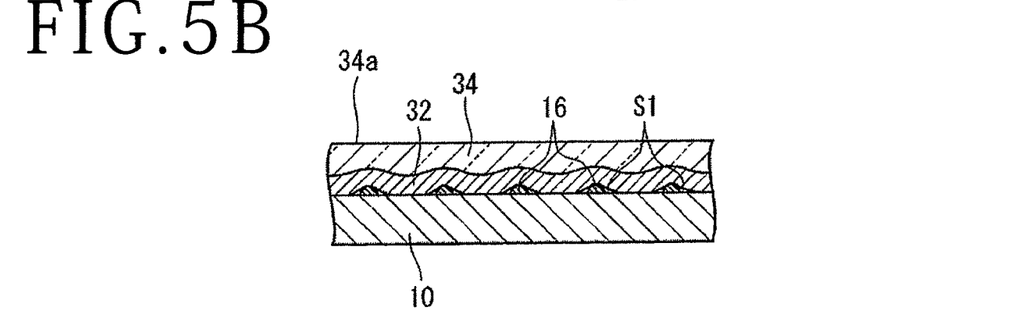
FIG. 5B is a sectional view taken alone line B-B of FIG. 5A.

In the second thermocompression bonding step mentioned above, the temperature of the heating roller 40 has been set to 120° C. which is the melting temperature of the polyethylene sheet selected as the second thermocompression bonding sheet 34. However, the first thermocompression bonding sheet 32 is a polypropylene sheet, and the melting temperature of the polypropylene sheet is 160° C. to 180° C. as above-mentioned. Therefore, even when the second thermocompression bonding sheet 34 is brought into the fluid state upon heating by the heating roller 40, the first thermocompression bonding sheet 32 is not brought into a fluid state, and the state upon thermocompression bonding of the first thermocompression bonding sheet 32 onto the front surface 10a of the wafer 10, that is, the state in which the first thermocompression bonding sheet 32 is thermocompression bonded without completely enveloping the bumps 16 formed on the front surface 10a of the wafer 10, is maintained. As a result, the thermocompression bonding step including the first thermocompression bonding step and the second thermocompression bonding step is completed, and the thermocompression bonding sheet (the first thermocompression bonding sheet 32 and the second thermocompression bonding sheet 34) constituting a protective member for protecting the front surface 10a of the wafer 10 and the wafer 10 are united.

When the thermocompression bonding step as above is completed, a back surface processing step is conducted in which a back surface 10b of the wafer 10 united by the thermocompression bonding step is ground to form the wafer 10 to a predetermined thickness. This will be described more specifically below referring to FIGS. 6 and 7.

Figure 6:
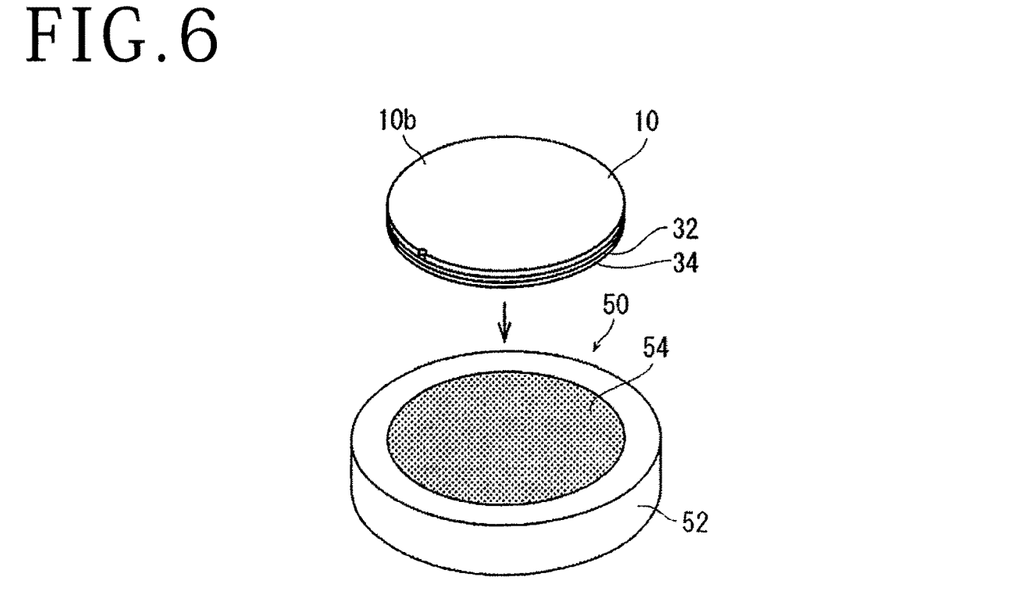
FIG. 6 is a perspective view depicting a state in which the wafer united with the thermocompression bonding sheets is placed on a chuck table of a grinding apparatus.

The wafer 10 united with the thermocompression bonding sheet by the thermocompression bonding step is conveyed to a chuck table 52 of a grinding apparatus 50 (only partly illustrated) depicted in FIG. 6, and is placed on an air-permeable suction chuck 54 formed at an upper surface of the chuck table 52, with the side of the thermocompression bonding of the first thermocompression bonding sheet 32 and the second thermocompression bonding sheet 34 directed to the lower side. The chuck table 52 is connected with suction means (not illustrated), and by operating the suction means, the wafer 10 is suction held by the chuck table 52 through the first thermocompression bonding sheet 32 and the second thermocompression bonding sheet 34.

Figure 7:
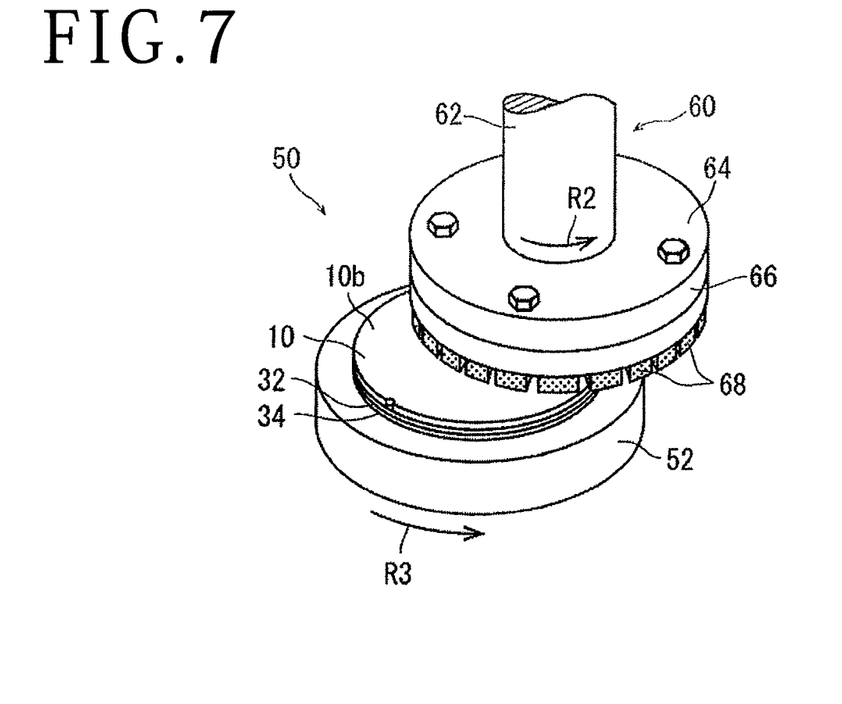
FIG. 7 is a perspective view depicting a mode in which a back surface of the wafer is ground.

As illustrated in FIG. 7, the grinding apparatus 50 include grinding means 60 for grinding the back surface 10b of the wafer 10 suction held on the chuck table 52 to thin the wafer 10. The grinding means 60 includes a rotary spindle 62 rotated by a rotational driving mechanism (not illustrated), a mounter 64 mounted to a lower end of the rotary spindle 62, and a grinding wheel 66 mounted to a lower surface of the mounter 64, with a plurality of grindstones 68 arranged in an annular pattern on a lower surface of the grinding wheel 66.

After the wafer 10 is suction held onto the chuck table 52, the rotary spindle 62 of the grinding means 60 is rotated, for example, at 3,000 rpm in the direction of arrow R2 in FIG. 7, and, in this condition, the chuck table 52 is rotated, for example, at 300 rpm in the direction of arrow R3 in FIG. 7. Then, while supplying the wafer 10 with grinding water through the rotary spindle 62 by grinding water supplying means (not illustrated), the grindstones 68 are put into contact with the back surface 10b of the wafer 10, and the grinding wheel 66 supporting the grindstones 68 is put into grinding feeding downward at a grinding feeding rate of 1 μm/sec, for example. In this instance, grinding can be made to progress while measuring the thickness of the wafer 10 by a contact-type measuring gauge (not illustrated). After the back surface 10b of the wafer 10 is ground by a predetermined amount and the wafer 10 is thinned to a predetermined thickness, the grinding means 60 is stopped. In this way, the back surface grinding step of grinding the back surface 10b of the wafer 10 is completed.

Figure 8:
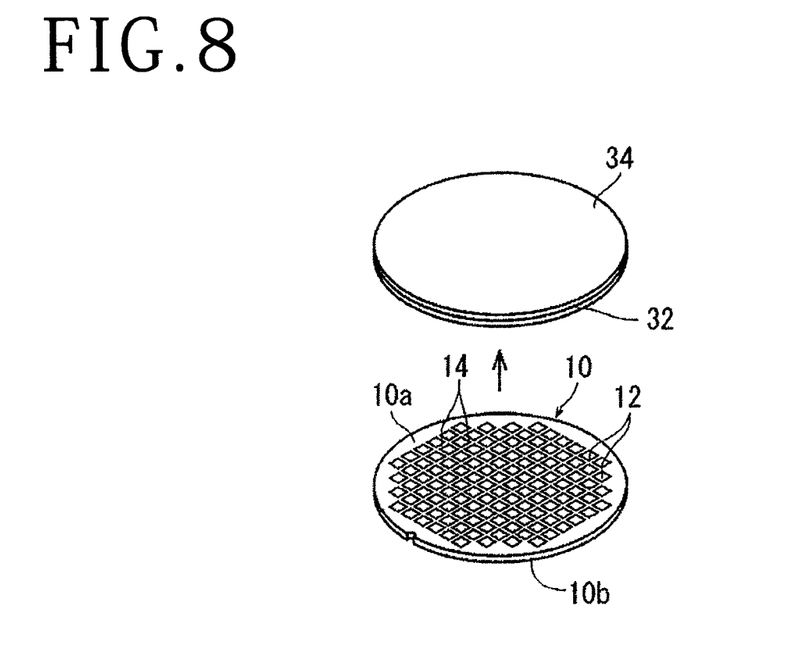
FIG. 8 is a perspective view depicting a mode in which the thermocompression bonding sheets are peeled from the wafer, after the grinding depicted in FIG. 7.

After the back surface processing step as above is completed, the wafer 10 is conveyed out from the chuck table 52 of the grinding apparatus 50, the ground back surface 10b is directed to the lower side, as depicted in FIG. 8, and the first thermocompression bonding sheet 32 and the second thermocompression bonding sheet 34 are peeled off from the front surface 10a of the wafer 10 (peeling step). After the peeling step is completed, the wafer 10 is conveyed to the next step (polishing step, dividing step, or the like), or conveyed to and accommodated into an accommodating container or the like for accommodating the wafers 10 of which the back surfaces have been processed.

According to the embodiment as above, the thermocompression bonding sheet to be thermocompression bonded to the wafer in the thermocompression bonding step includes the first thermocompression bonding sheet 32 and the second thermocompression bonding sheet 34. The first thermocompression bonding sheet 32 is thermocompression bonded to the front surface 10a of the wafer 10 without completely enveloping the bumps 16 formed on the front surface 10a of the wafer 10. The second thermocompression bonding sheet 34 is brought into a fluid state, its one end side surface is put into close contact with and thermocompression bonded to the first thermocompression bonding sheet, and the surface on the upper surface 34a of the second thermocompression bonding sheet 34 is formed to be a flat surface. Therefore, the back surface 10b of the wafer 10 can be favorably processed without being influenced by projections such as the bumps 16. Further, at the time of peeling the first thermocompression bonding sheet 32 from the front surface 10a of the wafer 10 after the processing of the back surface 10b is performed, a glue or the like of a pressure sensitive adhesive layer would not remain adhering to the front surface 10a of the wafer 10, and a problem such as tearing-off of the bumps 16 by the first thermocompression bonding sheet 32 and the resultant damaging of devices 12 can be avoided.

Figure 9:
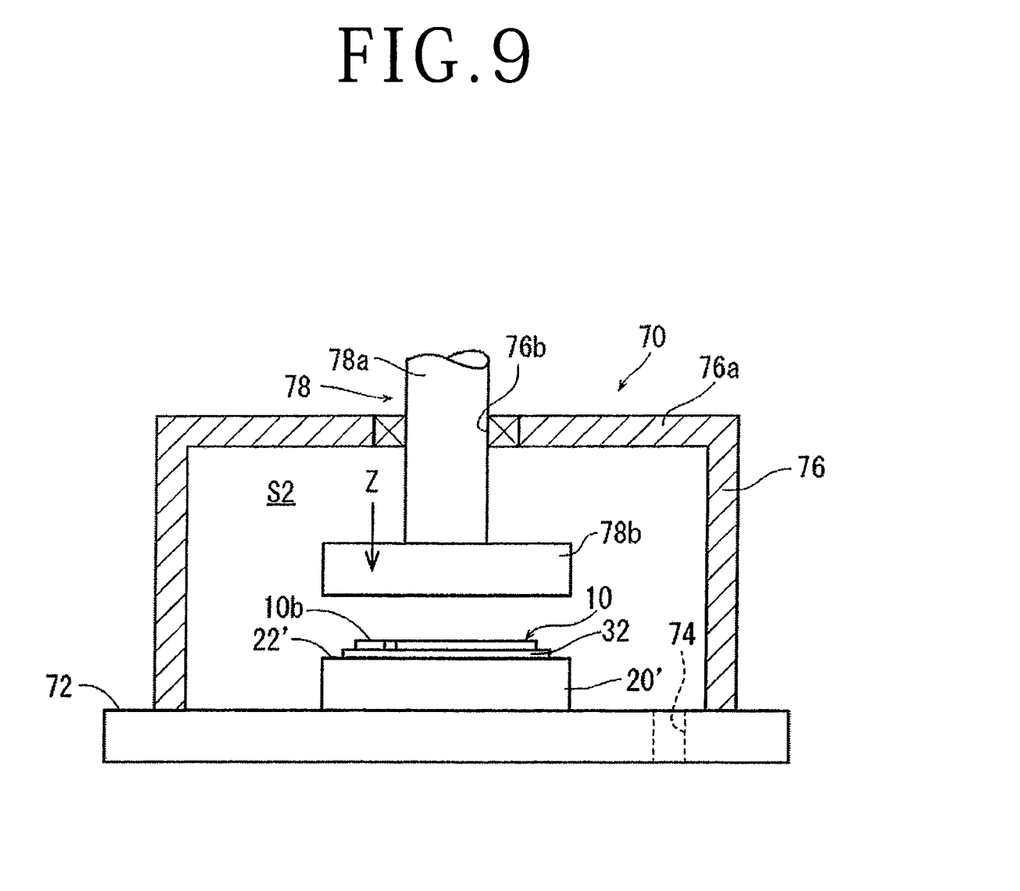
FIG. 9 is a partly sectional side view of a thermocompression bonding apparatus disclosed as another embodiment of the thermocompression bonding step.

According to the present invention, the above-described embodiment is not limitative, and various modifications are provided. While the thermocompression bonding step has been carried out using the heating roller 40 incorporating the heater for heating in the above-described embodiment, this is not restrictive. As another embodiment, for example, a thermocompression bonding apparatus 70 depicted in FIG. 9 may be used. Referring to FIG. 9, the function and effect of the thermocompression bonding apparatus 70 will be described while taking as an example a case where the first thermocompression bonding step is carried out.

The thermocompression bonding apparatus 70 includes a support table 20' with a heater for heating and a temperature sensor (both omitted from illustration) incorporated therein, a support base 72 on which to place and fix the support table 20', for forming a hermetically sealed environment including the support table 20', a suction hole 74 formed in the support base 72, and a hermetic sealing cover member 76 for forming a space S2 over the support base 72. Note that while FIG. 9 is a side view of the thermocompression bonding apparatus 70, the hermetic sealing cover member 76 is a box-shaped member covering the whole part of the upper surface of the support base 72, and, for convenience of explanation of the inside configuration, only the hermetic sealing cover member 76 is illustrated in section.

An upper wall 76a of the hermetic sealing cover member 76 is formed in its center with an opening 76b which is penetrated by a support shaft 78a of a pressing member 78 and through which the support shaft 78a is moved upward and downward. In addition, a seal structure is formed at the opening 76b supporting the outer periphery of the support shaft 78a such as to shield the space S2 in the hermetic sealing cover member 76 from the exterior to form a hermetically sealed environment, while permitting the support shaft 78a to move upward and downward. A pressing plate 78b is disposed at a lower end of the support shaft 78a.

The pressing plate 78b has a disk-like shape which is at least larger than the wafer 10 in diameter and is preferably comparable in size to the support table 20'. At a lower end surface of the hermetic sealing cover member 76, an elastic seal member is appropriately disposed (omitted from illustration) over the whole circumference. In addition, driving means (not illustrated) for moving the pressing member 78 upward and downward is disposed on the upper side of the pressing member 78.

The hermetic sealing cover member 76 is lifted upward to open the space S2, the first thermocompression bonding sheet 32 formed to be slightly larger in size than the wafer 10 is placed on an upper surface 22' of the support table 20', and the wafer 10 is placed on the first thermocompression bonding sheet 32, with its back surface 10b directed to the upper side. Next, the hermetic sealing cover member 76 is placed on the support base 72, to render the space S2 a hermetically sealed environment. In this instance, the pressing plate 78b is pulled up to an upper position for not making contact with the upper surface of the wafer 10, as depicted in FIG. 9.

Figure 3B:
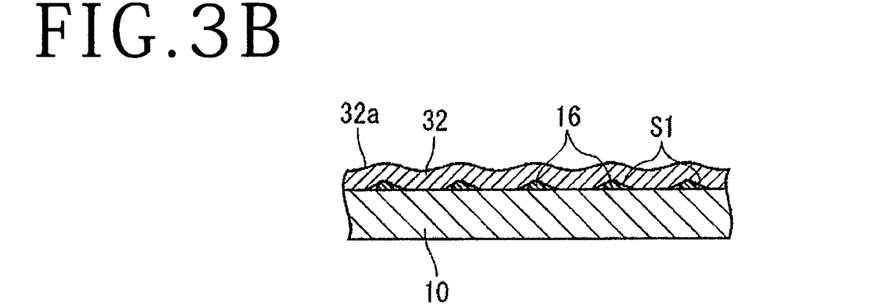
FIG. 3B is a sectional view take along line A-A of FIG. 3A.

After the space S2 formed inside the hermetic sealing cover member 76 is rendered a hermetically sealed environment, suction means (not illustrated) is operated to suck out air from within the space S2 through the suction port 74, to decompress the region inclusive of the wafer 10 to a state near vacuum. Simultaneously with this, an electric heater and a temperature sensor (not illustrated) incorporated in the support table 20' are operated to control the temperature of the support table 20', whereby heat is applied to the polypropylene sheet constituting the first thermocompression bonding sheet 32, thereby heating the latter to 100° C. Further, driving means (not illustrated) is operated to lower the pressing plate 78b in the direction of arrow Z, to press the whole part of the upper surface of the wafer 10 with a uniform force. The space S2 in which the wafer 10 is accommodated has been decompressed to a state near vacuum, and air is appropriately sucked and removed from the wafer 10 and the first thermocompression bonding sheet 32. Then, the first thermocompression bonding sheet 20 is softened to such an extent as not to be fluid, by being heated to the above-mentioned temperature, and exhibits pressure sensitive adhesiveness, whereby the wafer 10 and the first thermocompression bonding sheet 32 are thermocompression bonded to each other in a state as depicted in FIG. 3B.

After the first thermocompression bonding step is carried out by the thermocompression bonding apparatus 70, the wafer 10 united with the first thermocompression bonding sheet 32 is taken out from the support table 20'. Since the upper surface 22' of the support table 20' is coated with a fluororesin, the first thermocompression bonding sheet 32 united with the wafer 10 can be easily peeled off from the upper surface 22'. Then, the second thermocompression bonding sheet 34 is placed on the upper surface 22' of the support table 20', the wafer 10 is placed thereon, with the first thermocompression bonding sheet 32 side directed to the lower side, to put the second thermocompression bonding sheet 34 in close contact with the first thermocompression bonding sheet 32, and a second thermocompression bonding step is performed. The procedure of carrying out the second thermocompression bonding step is similar to that of the first thermocompression bonding step, but, in this case, the setting temperature of the heater incorporated in the support table 20' is set to 120° C. which is in the region of the melting temperature of the polyethylene sheet constituting the second thermocompression bonding sheet 34. By this, the second thermocompression bonding sheet 34 makes close contact with the first thermocompression bonding sheet 32 while being fluid, resulting in that the thermocompression bonding sheets are thermocompression bonded to each other in a state the same or similar to the state described above based on FIG. 5B.

In the above-described two embodiments, both the first and second thermocompression bonding sheets have been selected from among polyolefin sheets; specifically, a polypropylene sheet has been selected as the first thermocompression bonding sheet 32, and a polyethylene sheet has been selected as the second thermocompression bonding sheet 34, but this is not limitative of the present invention. The thermocompression bonding sheets may be selected from among either of polyolefin sheets and polyester sheets. As a polyolefin sheet, a polystyrene sheet (melting temperature: 220° C. to 240° C.) may be selected, other than the above-mentioned sheets. Where the thermocompression bonding sheets are selected from among polyester sheets, sheets of polyethylene terephthalate (melting temperature: 250° C. to 270° C.) and polyethylene naphthalate (melting temperature: 160° C. to 180° C.) may be selected. Besides, the first thermocompression bonding sheet 32 may be selected from among polyester sheets, while the second thermocompression bonding sheet 34 may be selected from among polyolefin sheets. In that case, for example, a polyethylene naphthalate sheet may be selected as the first thermocompression bonding sheet 32, while a polyethylene sheet may be selected as the second thermocompression bonding sheet 34. Similarly, the first thermocompression bonding sheet 32 may be selected from among polyolefin sheets, while the second thermocompression bonding sheet 34 may be selected from among polyester sheets.

When selecting the first thermocompression bonding sheet 32 and the second thermocompression bonding sheet 34, it is preferable to select them in such a manner that the melting temperature of the second thermocompression bonding sheet 34 is lower than the melting temperature of the first thermocompression bonding sheet 32. By such a selection, it is ensured that, when uniting the first thermocompression bonding sheet 32 with the wafer 10, the first thermocompression bonding step for thermocompression bonding can be carried out without completely enveloping projections such as the bumps 16 on the wafer 10, and, when performing the second thermocompression bonding step, the first thermocompression bonding sheet 32 can be prevented from getting fluid, in other words, the state of being thermocompression bonded without completely enveloping the projections such as the bumps 16 can be maintained, even when the second thermocompression bonding sheet 34 is heated to its melting temperature such as to render the second thermocompression bonding sheet 34 fluid by heating.

While an example in which grinding is conducted as a back surface processing step of processing the back surface of the wafer 10 has been described in the above embodiments, this is not restrictive of the present invention. The processing applied to the back surface of the wafer 10 may be other processing, such as, for example, polishing or cutting.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer uniting method of laying a thermocompression bonding sheet, which functions as a protective member in a processing step of processing a back surface of a wafer formed on a front surface thereof with a plurality of devices partitioned by a plurality of intersecting streets, on the front surface of the wafer and uniting the wafer with the thermocompression bonding sheet, the method comprising:
   a thermocompression bonding step of causing the thermocompression bonding sheet having a size comparable to or greater than a size and a shape of the wafer and the front surface of the wafer to face each other, and pressing them against each other while applying heat, to thermocompression bond the thermocompression bonding sheet to the front surface of the wafer,
   wherein the thermocompression bonding sheet is thermocompression bonded to the wafer in the thermocompression bonding step and includes at least a first thermocompression bonding sheet and a second thermocompression bonding sheet, and
   wherein the first thermocompression bonding sheet having no adhesive layer, is thermocompression bonded to the front surface of the wafer without completely enveloping projections formed on the front surface of the wafer, and
   wherein the second thermocompression bonding sheet has a first surface that is on and in close contact with the first thermocompression bonding sheet while having fluidity and thermocompression bonded to the first thermocompression bonding sheet, and has another surface thereof formed to be a flat surface.

2. The wafer uniting method according to claim 1, wherein the first thermocompression bonding sheet and the second thermocompression bonding sheet each include a polyolefin sheet.

3. The wafer uniting method according to claim 1, wherein the first thermocompression bonding sheet includes a polyester sheet, and the second thermocompression bonding sheet includes a polyolefin sheet.

4. The wafer uniting method according to claim 2, wherein the first thermocompression bonding sheet is a polypropylene sheet, and the second thermocompression bonding sheet is a polyethylene sheet.

5. The wafer uniting method according to claim 3, wherein the first thermocompression bonding sheet is a polyethylene naphthalate sheet, and the second thermocompression bonding sheet is a polyethylene sheet.

6. The wafer uniting method according to claim 1, wherein the first thermocompression bonding sheet and the second thermocompression bonding sheet are selected in such a manner that a melting temperature of the second thermocompression bonding sheet is lower than a melting temperature of the first thermocompression bonding sheet.

7. The wafer uniting method according to claim 1, wherein the thermocompression bonding step includes pressing a heating roller on the first thermocompression bonding sheet to bond the first thermocompression bonding sheet on the front surface of the wafer.

8. The wafer uniting method according to claim 7, further comprising setting a temperature of the heating roller to 100° C. to 120° C.

9. The wafer uniting method according to claim 1, wherein the thermocompression bonding step includes pressing a heating roller on the second thermocompression bonding sheet to bond the second thermocompression bonding sheet to the first thermocompression bonding sheet.

10. The wafer uniting method according to claim 9, further comprising setting a temperature of the heating roller to 120° C. to 140° C.

* * * * *